(12) United States Patent
Abdo

(10) Patent No.: US 10,581,394 B2
(45) Date of Patent: *Mar. 3, 2020

(54) DRIVING THE COMMON-MODE OF A JOSEPHSON PARAMETRIC CONVERTER USING A SHORT-CIRCUITED COPLANAR STRIPLINE

(71) Applicant: INTERNATIONAL BUSINESS MACHINES CORPORATION, Armonk, NY (US)

(72) Inventor: Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/058,329

(22) Filed: Aug. 8, 2018

(65) Prior Publication Data
US 2018/0351521 A1 Dec. 6, 2018

Related U.S. Application Data

(63) Continuation of application No. 15/193,743, filed on Jun. 27, 2016, now Pat. No. 10,211,798.

(51) Int. Cl.
*H03F 19/00* (2006.01)
*H03F 7/00* (2006.01)
(Continued)

(52) U.S. Cl.
CPC ........... *H03F 19/00* (2013.01); *H01L 39/223* (2013.01); *H01L 39/2493* (2013.01); *H01P 5/12* (2013.01); *H03F 7/00* (2013.01)

(58) Field of Classification Search
CPC ....... H03F 19/00; H03F 7/00; H03K 19/1954; H03K 3/38; H01L 39/025; H01L 39/2493;
(Continued)

(56) References Cited

U.S. PATENT DOCUMENTS

| 3,863,078 A | 1/1975 | Zappe |
|---|---|---|
| 6,331,805 B1 | 12/2001 | Gupta et al. |

(Continued)

FOREIGN PATENT DOCUMENTS

| DE | 102004002228 A1 | 8/2005 |
|---|---|---|
| DE | 102004002228 B4 | 8/2005 |

(Continued)

OTHER PUBLICATIONS

Bergeal et al., "Analog information processing at the quantum limit with a Josephson ring modulator", Nature Physics, Published on-line: Feb. 14, 2010, pp. 1-7 (Year: 2010).*

(Continued)

*Primary Examiner* — Benny T Lee
*Assistant Examiner* — Hafizur Rahman
(74) *Attorney, Agent, or Firm* — Cantor Colburn LLP; Vazken Alexanian

(57) ABSTRACT

Techniques relate to an on-chip Josephson parametric converter. A Josephson ring modulator includes four nodes. A lossless on-chip flux line is capacitively coupled to two adjacent nodes of the four nodes of the Josephson ring modulator. The lossless on-chip flux line has an input port configured to receive a pump drive signal that couples differentially to the two adjacent nodes of the of the Josephson ring modulator. The pump drive signal thereby excites a common mode of the on-chip Josephson parametric converter.

20 Claims, 10 Drawing Sheets

(51) Int. Cl.
*H01P 5/12* (2006.01)
*H01L 39/22* (2006.01)
*H01L 39/24* (2006.01)

(58) Field of Classification Search
CPC .. H01P 11/001; H01P 5/19; H01P 5/16; H01P 5/103; H01P 5/12; H03D 7/005
USPC .......................................................... 330/4.5
See application file for complete search history.

(56) References Cited

U.S. PATENT DOCUMENTS

| | | | |
|---|---|---|---|
| 6,518,673 B2 * | 2/2003 | Herr .................. | H01L 27/18 257/37 |
| 7,268,713 B2 | 9/2007 | Suzuki et al. | |
| 8,571,614 B1 | 10/2013 | Mukhanov et al. | |
| 8,642,998 B2 | 2/2014 | Gambetta et al. | |
| 10,211,798 B2 * | 2/2019 | Abdo .................. | H03F 7/00 |
| 2014/0314419 A1 | 10/2014 | Paik | |
| 2015/0241481 A1 | 8/2015 | Narla et al. | |
| 2017/0373369 A1 | 12/2017 | Abdo | |

FOREIGN PATENT DOCUMENTS

| | | |
|---|---|---|
| JP | H03286621 A | 12/1991 |
| JP | 2861229 B2 | 2/1999 |
| JP | 4132193 B2 | 8/2008 |
| JP | 5167504 B2 | 3/2013 |
| WO | 2015057839 A1 | 4/2015 |

OTHER PUBLICATIONS

Rafique, R., "Towards Superconducting Monolithic Microwave Integrated Circuits", Department of Micro Technology and Nanoscience (MC2) Chalmers University of Technology, Göteborg, Sweden 2008, Section 1.2.1 (Year: 2008).*
List of IBM Patents or Patent Applications Treated as Related, (Appendix P), Filed Aug. 8, 2018; pp. 1-2.
B. Abdo, et al.,"Josephson Directional Amplifier for Quantum Measurement of Superconducting Circuits", Physical Review Letters, PRL 112, Apr. 22, 2014, p. 1-5.
B. Addo, et al.,"Nondegenerate three-wave mixing with the Josephson ring modulator", Physical Review, B 87, Jan. 16, 2013, p. 1-18.
J.Y. Mutus, et al.,"Design and characterization of a lumped element single-ended superconducting microwave parametric amplifier with on-chip flux bias line", Applied Physics Letters, vol. 103, 2013, p. 1-5.
L.S. Kuzmin, et al.,"Microwave Receivers Using Squids and Josephson Junction Arrays", IEEE Transactions on Magnetics, vol. 17, No. 1, Jan. 1981, p. 1-4.
M. Hatridge, et al.,"Dispersive magnetometry with a quantum limited SQUID parametric amplifier", American Physical Society, Review B, 83, Apr. 4, 2011, p. 1-8.
Macklin, et al., "A near-quantum-limited Josephson traveling-wave parametric amplifier", Science Journal, vol. 350, Issue 6258, 2015, pp. 307-310, Science.
N.E. Frattini, et al.,"Hybrid-free Josephson Parametric Converter1", Bulletin of the American Physical Society, Department of Applied Physics, Yale University, Mar. 14-18, 2016, p. 1 (Abstract only).
T. Yamamot, et al.,"Flux-driven Josephson parametric amplifier", Applied Physics Letters, 93, 2008, p. 1-4.
Yaakobi, et al., "Parametric amplification in Josephson junction embedded transmission lines", Phys. Rev. B 87, 144301, 2013, Physical Review B, 9 pages.

* cited by examiner

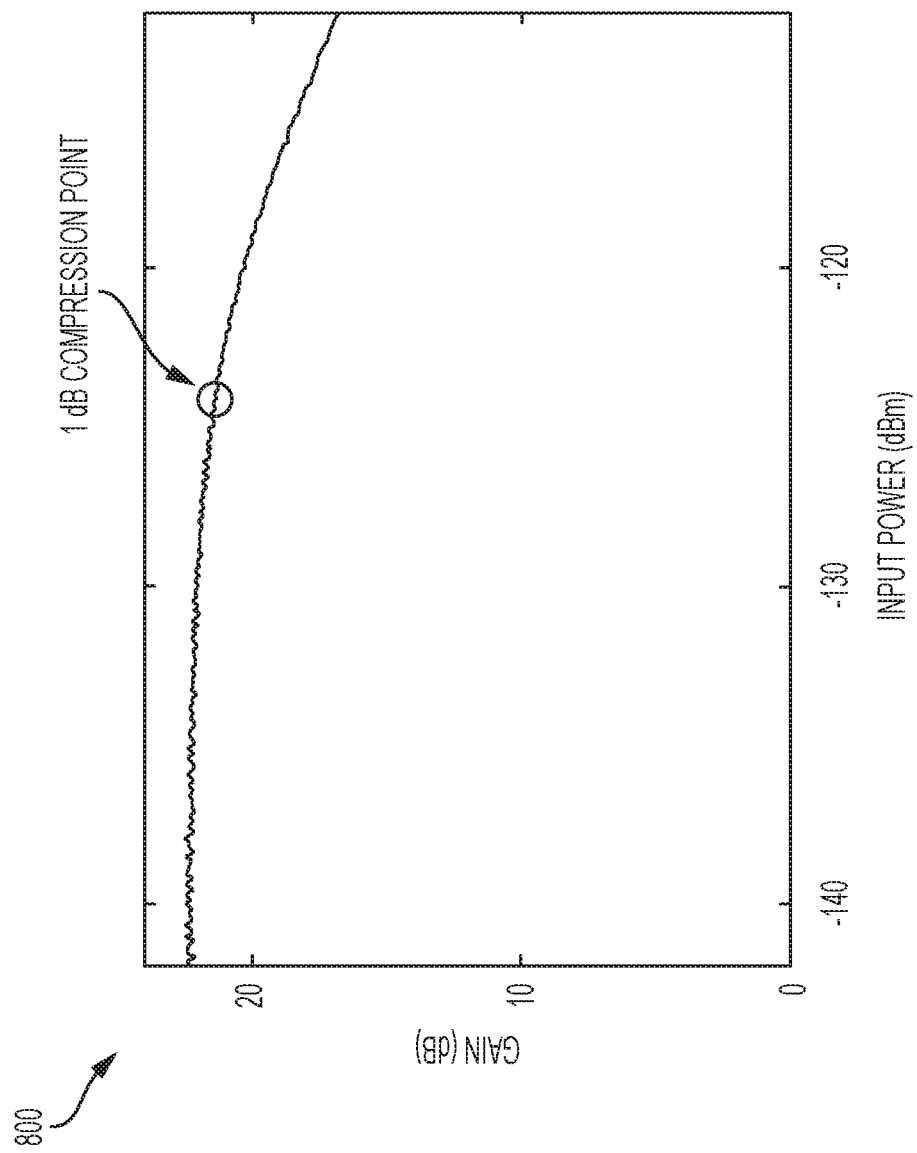

PROVIDE A LOSSLESS ON-CHIP FLUX LINE IN A PROXIMITY TO A JOSEPHSON RING MODULATOR OF THE ON-CHIP JOSEPHSON PARAMETRIC CONVERTER SUCH THAT THE LOSSLESS ON-CHIP FLUX LINE COUPLES CAPACITIVELY TO TWO ADJACENT NODES OF THE JOSEPHSON RING MODULATOR 1005

TRANSMIT A MICROWAVE SIGNAL AS THE PUMP DRIVE TO THE ON-CHIP JOSEPHSON PARAMETRIC CONVERTER USING THE LOSSLESS ON-CHIP FLUX LINE 1010

DRIVING THE COMMON-MODE OF A JOSEPHSON PARAMETRIC CONVERTER USING A SHORT-CIRCUITED COPLANAR STRIPLINE

DOMESTIC PRIORITY

This application is a continuation of U.S. Non-Provisional application Ser. No. 15/193,743 entitled "DRIVING THE COMMON-MODE OF A JOSEPHSON PARAMETRIC CONVERTER USING A SHORT-CIRCUITED COPLANAR STRIPLINE", filed Jun. 27, 2016, which has been issued as a U.S. Pat. No. 10,211,798 on Feb. 19, 2019 the content of which is incorporated herein by reference in its entirety.

BACKGROUND

The present invention relates generally to electronic devices, and more specifically, to driving the common-mode of a Josephson parametric converter using a short-circuited coplanar stripline.

A Josephson ring modulator (JRM) is a nonlinear dispersive element based on Josephson tunnel junctions that can perform three-wave mixing of microwave signals at the quantum limit. The JRM consists of Josephson Junctions (JJs). In order to construct a non-degenerate parametric device, namely the Josephson parametric converter (JPC), which is capable of amplifying and/or mixing microwave signals at the quantum limit, the JRM is coupled to two different microwave resonators.

In microstrip JPCs, as well as compact and shunted JPCs, the pump drive that provides the energy for the amplification process is fed through the sum port ($\Sigma$) of a 180 degree hybrid coupler. The difference port ($\Delta$) of the same hybrid coupler is used to feed the signal or idler tones to the JPC. In this configuration, both the pump and the signal or idler are fed to the JPC through the same feedlines and coupling capacitors of the JPC. The 180 degree hybrid coupler is connected to these feedlines.

SUMMARY

According to one or more embodiments, an on-chip Josephson parametric converter is provided. The on-chip Josephson parametric converter includes a Josephson ring modulator including four nodes, and a lossless on-chip flux line capacitively coupled to two adjacent nodes of the four nodes of the Josephson ring modulator. The lossless on-chip flux line has an input port configured to receive a pump drive signal that couples differentially to the two adjacent nodes of the of the Josephson ring modulator, the pump drive signal thereby exciting a common mode of the on-chip Josephson parametric converter.

According to one or more embodiments, a method of forming an on-chip Josephson parametric converter is provided. The method includes forming a Josephson ring modulator including four nodes, and forming a lossless on-chip flux line capacitively coupled to two adjacent nodes of the four nodes of the Josephson ring modulator. The lossless on-chip flux line has an input port configured to receive a pump drive signal that couples differentially to the two adjacent nodes of the of the Josephson ring modulator, the pump drive signal thereby exciting a common mode of the on-chip Josephson parametric converter.

According to one or more embodiments, a method of injecting a pump drive to an on-chip Josephson parametric converter is provided. The method includes providing a lossless on-chip flux line in a proximity to a Josephson ring modulator of the on-chip Josephson parametric converter such that the lossless on-chip flux line couples capacitively to two adjacent nodes of the Josephson ring modulator. Also, the method includes transmitting a microwave signal as the pump drive to the on-chip Josephson parametric converter using the lossless on-chip flux line.

BRIEF DESCRIPTION OF THE DRAWINGS

FIGS. 8A and 8B are graphs of gain versus input power applied to the signal (S) and idler (I) ports at resonance, while driving the pump (P) through the flux line according to one or more embodiments.

FIG. 10 is a flow chart of a method of injecting a pump (P) drive tone to an on-chip Josephson parametric converter according to one or more embodiments.

DETAILED DESCRIPTION

Figure 1:
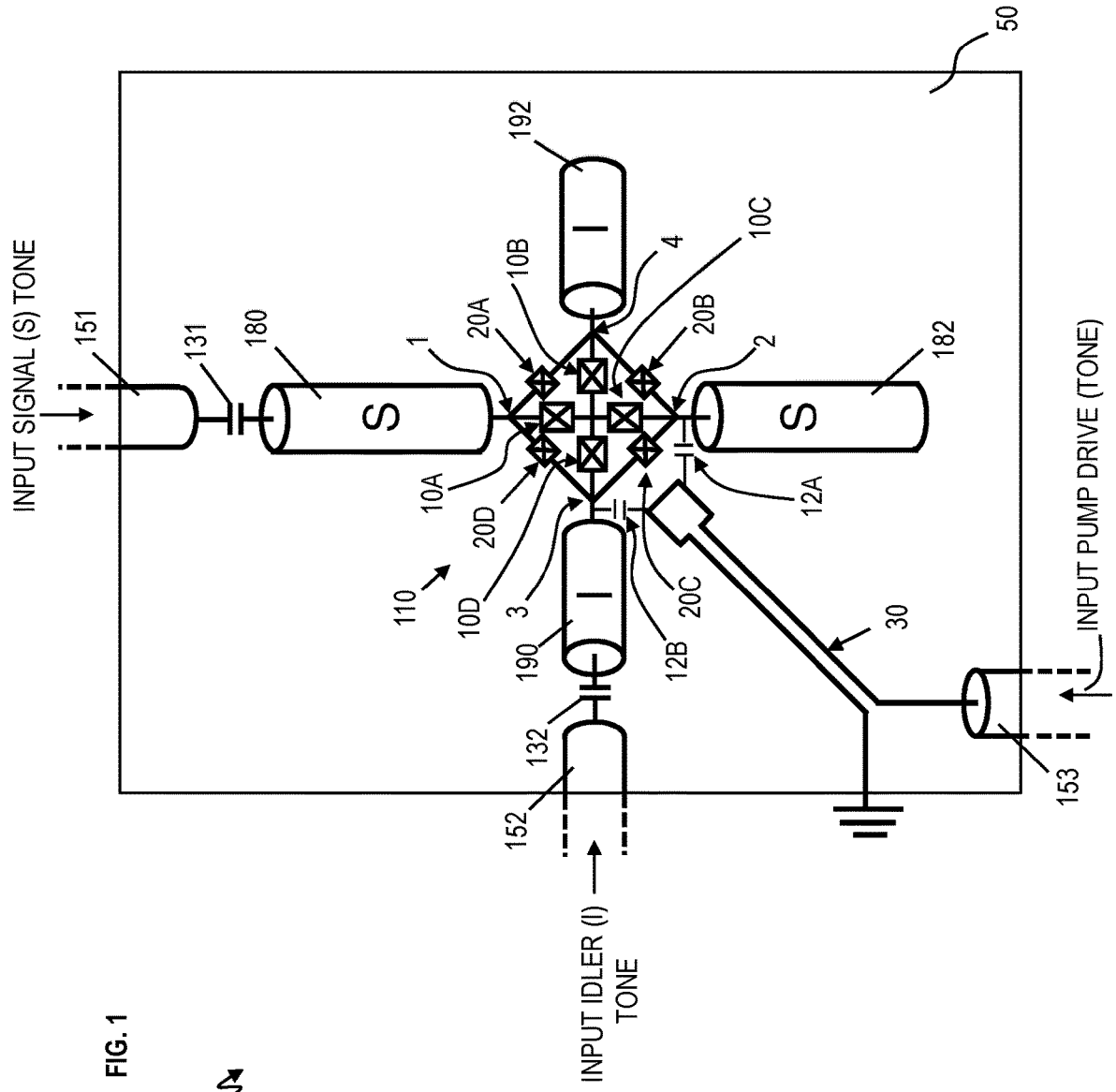
FIG. 1 is a circuit for an on-chip Josephson parametric converter having a common-mode driven using a flux line according to one or more embodiments.

Various embodiments are described herein with reference to the related drawings. Alternative embodiments may be devised without departing from the scope of this document. It is noted that various connections and positional relationships (e.g., over, below, adjacent, etc.) are set forth between elements in the following description and in the drawings. These connections and/or positional relationships, unless specified otherwise, may be direct or indirect, and are not intended to be limiting in this respect. Accordingly, a coupling of entities may refer to either a direct or an indirect coupling, and a positional relationship between entities may be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

According to one or more embodiments, principles are directed to driving the common-mode of a Josephson parametric converter (JPC) using a flux line for injecting a pump drive. In the JPC, the incoming and outgoing signals to (in) and from (out) of the JPC device travel on the same transmission lines and feedlines. In accordance with one or more embodiments, it is disclosed to feed the pump (P) drive, the signal (S) tone, and idler (I) tone to the Josephson parametric converter using separate feedlines and coupling capacitors for each. The signal and idler tones continue to be fed through the coupling capacitors of the JPC resonators, but the pump drive is now being fed to the Josephson parametric converter through a lossless on-chip flux line which is implemented in the form of a short-circuited coplanar stripline in the vicinity of the Josephson ring modulator (JRM) of the JPC. Due to the proximity of the flux line to the JRM, the flux line couples capacitively to two adjacent nodes of the JRM; since the flux line is implemented as a short-circuited coplanar stripline, a pump drive applied to the flux line couples differentially to the two adjacent nodes of the JRM and consequently excites the common mode of the JRM. In other words, due to the proximity of the two wires/strips of the superconducting flux line near the JRM, the two wires/strips function as a coplanar stripline for microwave frequencies (e.g., the pump frequency), and since the two wires/strips are shorted near the JRM, this boundary condition imposes an RF (radio frequency) voltage node for the microwave signal (e.g., pump drive) at this location and causes the RF voltage (sometimes referred to as an AC voltage) of the microwave signal to have different signs on the two strips. Due to the finite capacitive coupling between the two strips and the two adjacent nodes of the JRM (e.g., nodes 2 and 3) such differential mode supported by the coplanar stripline excites in turn the common mode of the JRM (i.e., the polarity of the RF-voltages on opposite nodes is the same, while the polarity of the RF-voltages on adjacent nodes (e.g., adjacent nodes 2 and 3) is different).

In amplification, the pump frequency is at the sum of the idler and signal frequencies, and since the idler and signal frequencies are in the 4-15 gigahertz range, the pump frequency is typically several gigahertz apart from the signal and idler frequencies (i.e., is higher than the idler and signal frequencies). Thus, in order to feed both the pump and signal or idler tones through the same hybrid coupler, the hybrid needs to be broadband enough to accommodate those two different frequencies in the state-of-the-art. For that purpose, existing JPCs use commercial broadband hybrids which are big in size and are off chip. The addition of this bulky hardware limits scalability. To solve this problem, one can design and implement broadband hybrids on-chip but this would add complexity to the fabrication process as one would have to couple two JPCs on the same chip, for example, in order to form a quantum-limited Josephson directional amplifier. This is because placing the hybrids in plane would pose wire cross-over problems.

Additionally, two 180 degree hybrid couplers are usually utilized in the state-of-the-art. Usually, the pump and signal are fed through one hybrid coupler or the pump and idler are fed through the other hybrid coupler. Feeding the pump and the signal (or idler) tones to the JPC through the same coupling capacitors poses a tradeoff between the device bandwidth and dynamic range. By increasing the coupling capacitors of the resonators, the device bandwidth increases since the coupling to the feedline (i.e., external circuit) increases, but it also increases the coupling to the second harmonic resonance of the microstrip resonator which the pump tone (exciting the common mode) is close in frequency to. This softens the pump drive (makes it less "stiff") and consequently decreases the dynamic range of the JPC.

In accordance with embodiments, there are various benefits of feeding the pump drive, the signal tone, and idler tone to the Josephson parametric converter using separate feedlines and coupling capacitors for each, where the pump drive is fed to the Josephson parametric converter through a lossless on-chip flux line. Particularly, hybrid couplers are not needed for feeding or driving the JPC in embodiments. The new excitation method yields a smaller footprint and involves a similar design and fabrication processes. It is beneficial not to use hybrids at all because they might require wire cross-overs but if for some reason it is not an issue (due to the use of advanced and reliable fabrication process), another benefit is that the pump drive does not need to share a hybrid or physical port with the input and output signals of the signal (S) and idler (I). Also, in the case that hybrids are used, the hybrids do not need to be broadband covering a large bandwidth (usually >10 GHz). By implementation the flux line as a short-circuited coplanar stripline in the vicinity of the (JRM) of the JPC, the flux line couples capacitively to two adjacent nodes of the JRM such that a pump drive applied to the flux line couples differentially to the two adjacent nodes of the JRM and consequently excites the common mode of the JRM without the use of hybrid couplers.

Embodiments provide complete separation between the physical ports/feedline that carry the incoming and outgoing waves of the signal, idler, and pump tones. In addition to simplifying the JPC device circuit and not needing broadband hybrids to drive device, such separation between the different ports/feedlines opens the door for separate optimization of each port/feedline in order to achieve optimal performance of the device with regard to bandwidth and maximum input power.

Since the on-chip flux line can carry DC current, the on-chip flux can be used to flux-bias the device at different working points without requiring the use of external magnetic coils. By eliminating the need to use external bulky broadband hybrids and magnetic coils, the JPC device footprint becomes significantly smaller which can be beneficial in scalable architectures. By eliminating the need to use external bulky broadband hybrids and magnetic coils, on-chip integration of two or more JPCs or integration of JPCs and superconducting qubits becomes significantly more feasible.

Now turning to the figures, FIG. 1 is a circuit for an on-chip Josephson parametric converter 100 having a common-mode driven using a lossless on chip flux line according to one or more embodiments. The JPC 100 is on a chip 50.

Figure 2:
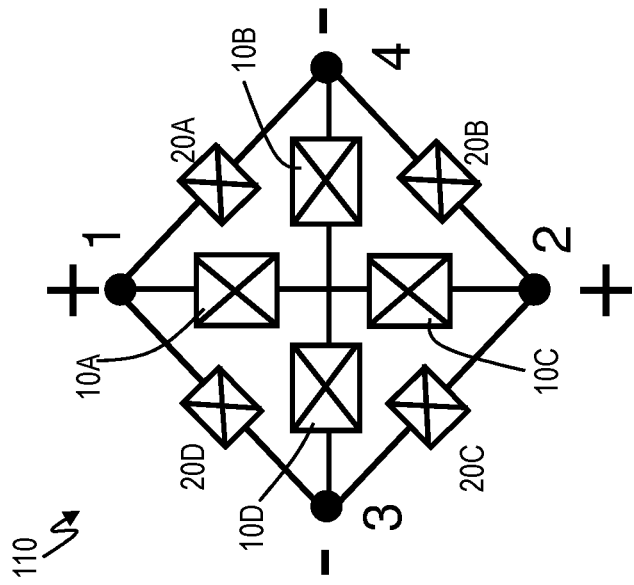
FIG. 2 is an enlarged view of the Josephson ring modulator according to one or more embodiments.

The JPC 100 includes a Josephson ring modulator (JRM) 110. The JRM 110 includes four nodes 1, 2, 3, and 4. The JRM 110 further includes Josephson junctions 20A, 20B, 20C, and 20D arranged in a Wheatstone Bridge-like configuration with respect to the four nodes 1-4 (that is, in a ring configuration with the nodes 1-4 inter-dispersed between the junctions 20A-20D), in which junction 20A is between nodes 1 and 4, junction 20B is between nodes 4 and 2, junction 20C is between nodes 2 and 3, and junction 20D is between nodes 1 and 3. The Josephson junctions 20A-20D form a superconducting loop threaded by an applied magnetic flux Φ from a lossless on-chip flux line 30. In one implementation, the flux bias applied to the ring is half a flux-quantum. It is appreciated that other amounts can also be used, depending upon the application. In particular, if a flux-tunable version of the JRM 110 is implemented where each Josephson junction 20A-20D in the JRM is shunted by a linear inductance (of inductors 10A-10D), other amounts of magnetic flux Φ from the lossless on-chip flux line 30 is utilized. As such, the JRM 110 may include inductors 10A, 10B, 10C, and 10D which help to tune the JRM 110. Each of the inductors 10A-10D are connected together at one end, and their opposites ends are respectively connected to nodes 1, 2, 3, and 4 (an enlarged view is depicted in FIG. 2).

The JPC 100 also includes 2 transmission line resonators that intersect at the JRM 110. One transmission line resonator is a signal (S) resonator that includes two transmission lines 180 and 182 of length $l_s/2$ each, and the two transmission lines 180 and 182 (which form the signal (S) half-wavelength transmission line resonator) are connected together by the JRM 110. The other transmission line resonator is an idler resonator (I) that includes two transmission lines 190 and 192 of length $l_i/2$ each, and the two transmission lines 190 and 192 (which form the idler (I) half-wavelength transmission line resonator) are connected together by the JRM 110. The signal (S) resonator can be denoted as 180, 182, and the JRM 110. The idler (I) resonator can be denoted as 190, 192, and the JRM 110. Applying a signal/idler tone that lies within the bandwidth of the signal/idler resonator excites the X/Y mode respectively of the JRM. "Signal (S)" may be interchangeably denoted herein as "signal 1", while idler (I) may be interchangeably denoted herein as "signal 2". The respective lengths of the signal (S) and the idler (I) transmission line resonators and the Josephson inductance of the JRM 110 at the JPC device working point (i.e., the flux bias threading the JRM loop) determine the resonance frequencies of the JPC 100. In general, length $l_s \approx \lambda_s/2$ and length $l_i \approx \lambda_i/2$, where $\lambda_s$ and $\lambda_i$ correspond to the wavelength of the fundamental mode of the S and I resonators respectively. The signal (S) resonator and the idler (I) resonator support a different one of two differential Eigenmodes of the JRM 110, such as the "X" mode and "Y" mode.

The signal (S) tone is fed to nodes 1 and 2 of the JRM 110 through feedline 151 via a coupling capacitor 131. The idler (I) tone is fed to nodes 2 and 4 of the JRM 110 through feedline 152 via a coupling capacitor 132. It should be appreciated that the pair of nodes connected to the signal (S) and the idler (I) may be switched. A third tone, denoted as pump (P), is non-resonant and is input to adjacent nodes 2 and 3 of the JRM 110 via a lossless on-chip flux line (FL) capacitively coupled to the JRM 110 via coupling capacitors 12A and 12B. An example of the adjacent nodes is provided as nodes 2 and 3, and embodiments are not limited to these nodes. Any two adjacent nodes, one node connected to the signal (S) resonator and the other node connected to the idler (I) resonator, may be utilized. Both the signal (S) Eigenmode and the idler (I) Eigenmode are excited differentially, while the pump (P) is a common-mode drive. Where differential excitation of the JRM 110 means that the polarity of the RF voltages at opposite nodes of the JRM 110 is different, and common excitation means that the polarity of the RF voltages at opposite nodes of the JRM 110 is the same. The linear bandwidth of the signal (S) resonator denoted $\gamma_S$ and idler resonator (I) denoted $\gamma_I$ is mainly set by the coupling capacitors 131, 132 which couple the signal (S) resonator and idler resonator (I) to the respective feedlines. Thus, the signal (S) and the idler (I) tones, which lie within the bandwidths of the signal (S) resonator and idler resonator (I), couple to the differential modes of the JRM 110, while the pump (P) drive couples to the common-mode of the JRM 110. Denoting the frequency of the signal (S) tone $f_S$, the frequency of the idler (I) tone $f_I$, and assuming, without loss of generality, that $f_I > f_S$, the frequency of the pump drive $f_P$ is set to either the sum $f_I + f_S$ for amplification or the difference $f_I - f_S$ for frequency conversion without photon gain.

It is to be appreciated that one or more embodiments describe a specific implementation of a JPC in which the resonators included therein are realized using transmission line resonators. However, embodiments are not limited to this particular implementation, and thus, JPCs having other elements and/or other configurations can also be used in accordance with the teachings of the present principles, while maintaining the spirit of the present principles. For example, in other embodiments, the resonators can be implemented using lumped-elements. The discussions herein also apply to the JRM in that the present principles are not limited to the specific JRM configuration shown herein.

As can be recognized, the feedlines 151, 152, and 153 are separate. Each feedline has a port for connecting to the feedline. For example, the feedlines 151, 152, and 153 can be individually connected to, e.g., coaxial cables, etc. The signal (S) tone is fed to the signal (S) resonator 180, 182, and the JRM 110 through the feedline 151 via coupling capacitor 131. The idler (I) tone is fed to the idler (I) resonator 190, 192, and the JRM 110 through the feedline 152 via coupling capacitor 132. The pump (P) drive is fed to the flux line 30 through feedline 153, and the feedline 153 is separate from feedlines 151 and 152.

The flux line 30 couples to node 2 via coupling capacitor 12A and the flux line couples to node 3 via coupling capacitor 12B. FIG. 2 is an enlarged view of the Josephson ring modulator 110 according to one or more embodiments. The nodes 2 and 3 are adjacent nodes, and the flux line 30 differentially couples to the nodes 2 and 3 such that the pump drive is applied at a high frequency microwave signal to node 2 via capacitor 12A and to node 3 via capacitor 12B. In one implementation, the pump (P) drive (via superconducting flux line 30) may be applied at 17 GHz to the flux line 30 such that the high frequency microwave signal couples to both nodes 2 and 3. To provide amplification to the signal (S) and idler (I) tones, the pump (P) drive has a frequency that is $f_P$ which is the sum $f_I + f_S$, e.g., 17 GHz. This is exciting the common-mode of the JPC 100. In this example, the frequency $f_I$ may be about 10 GHz and the frequency $f_S$ may be about 7 GHz, thus the sum is 17 GHz.

Figure 3:
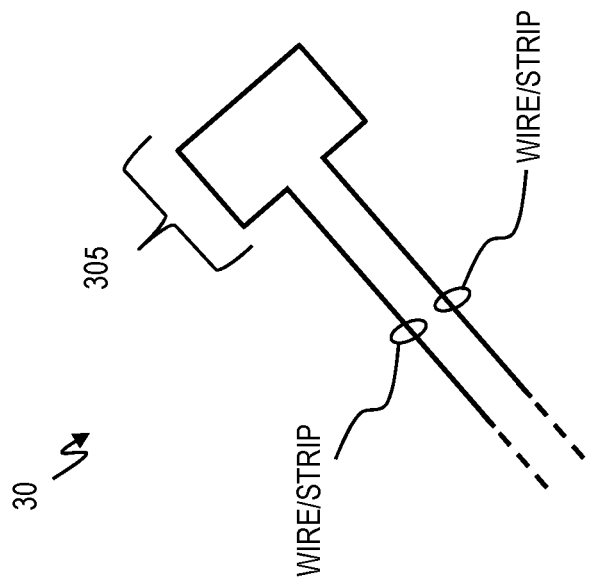
FIG. 3 is an enlarged view of the lossless on-chip flux line according to one or more embodiments.

An example microwave frequency for the pump (P) drive may range from about 3-20 GHz. In addition to the microwave signal applied as the pump (P) drive through flux line 30, a DC and/or AC current is applied via the flux line 30 to the JRM 110. The current from the DC and/or AC signal flowing in the flux line 30 open-loop 305 (FIG. 3) near the JRM 110 induces a magnetic flux $\Phi$ that threads the superconducting loop of the JRM 110. The magnetic flux $\Phi$ is received by the JRM 110 because of the mutual inductance between the superconducting loop of the JRM 110 and the flux line open-loop 305 of the flux line 30.

Use of the flux line 30 for the pump (P) tone provides complete separation between the physical ports 151, 152, and 153 that carry the incoming and outgoing waves of the signal (S), idler (I), and pump (P) tones. This separation simplifies the device circuit of the JPC 100 because there is no need to use commercial broadband hybrids to drive device.

Such separation between the different ports/feedlines 151, 152, 153 opens the door for separate optimization of each port/feedline in order to achieve optimal performance of the JPC 100 device with regard to bandwidth and maximum input power. Since the lossless on-chip flux line 30 can carry DC current, the DC current is used to flux-bias the JPC 100 device at different working points without requiring the use of external magnetic coils. By eliminating the need to use external bulky broadband hybrids and magnetic coils the device footprint becomes significantly smaller which is beneficial in scalable architectures. Another advantage of eliminating the off-chip commercial hybrids is eliminating the finite insertion loss on the order of 0.5-1 dB present in these normal-metal components which cause some portion of the quantum signal to be lost.

To excite the common-mode (also referred to as the Z mode), the nodes 1 and 2 are fed with the same polarity and the nodes 3 and 4 are fed with the same polarity.

Figure 4:
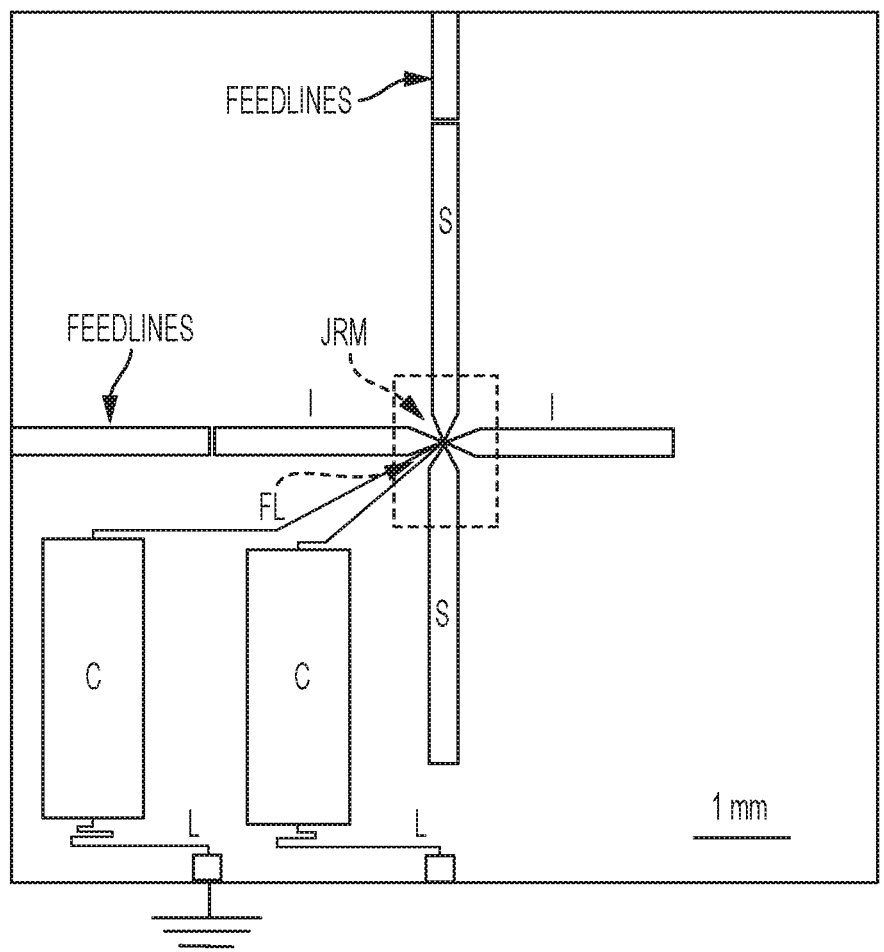
FIG. 4 represents a layout of a JPC device which incorporates an on-chip flux line realized as a short-circuited coplanar stripline on a chip according to one or more embodiments.

FIG. 4 shows a layout of an actual JPC device which includes an on-chip flux line that is capacitively coupled to two adjacent nodes of the JRM. It is noted that the one implementation has incorporated into the on-chip flux line (FL) a low-pass filtering element with a designed cut-off frequency around 1 GHz, aiming at reducing potential power leakage from the signal and idler resonators through the flux line. The filter does not affect the device physics. In FIG. 4, the basic low-pass filter consists of two series inductances in the form of relatively long and narrow superconducting wires denoted L and two shunting capacitances to ground in the form of large superconducting pads denoted C. It is also noted that this low-pass filter does not prevent one from applying a high frequency pump tone at around 17 GHz to the flux line (FL).

Figure 5:
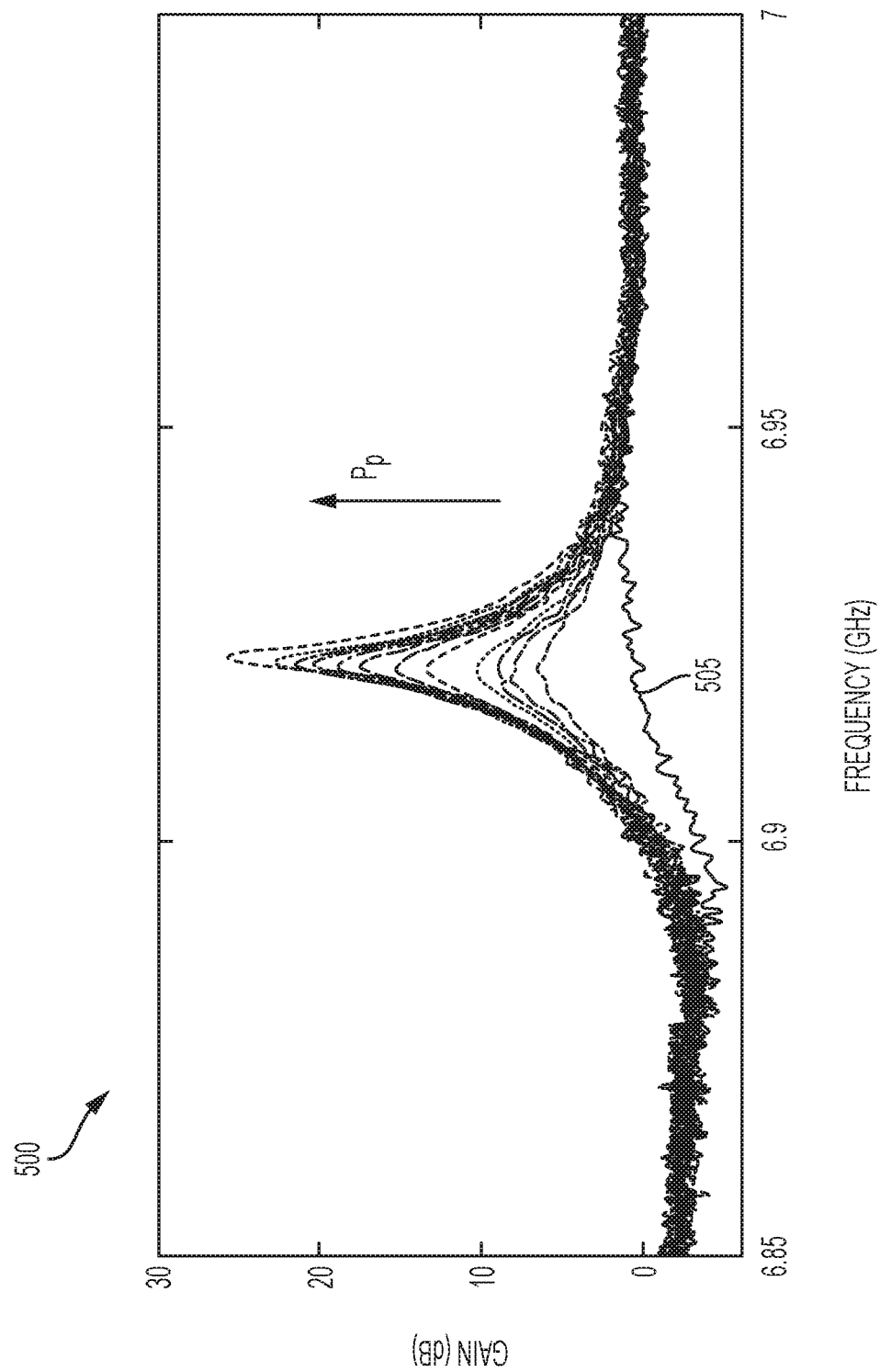
FIG. 5 is a graph showing measured signal (S) gain curves taken while using the lossless on-chip flux line to drive the pump (P) tone according to one or more embodiments.
Figure 6:
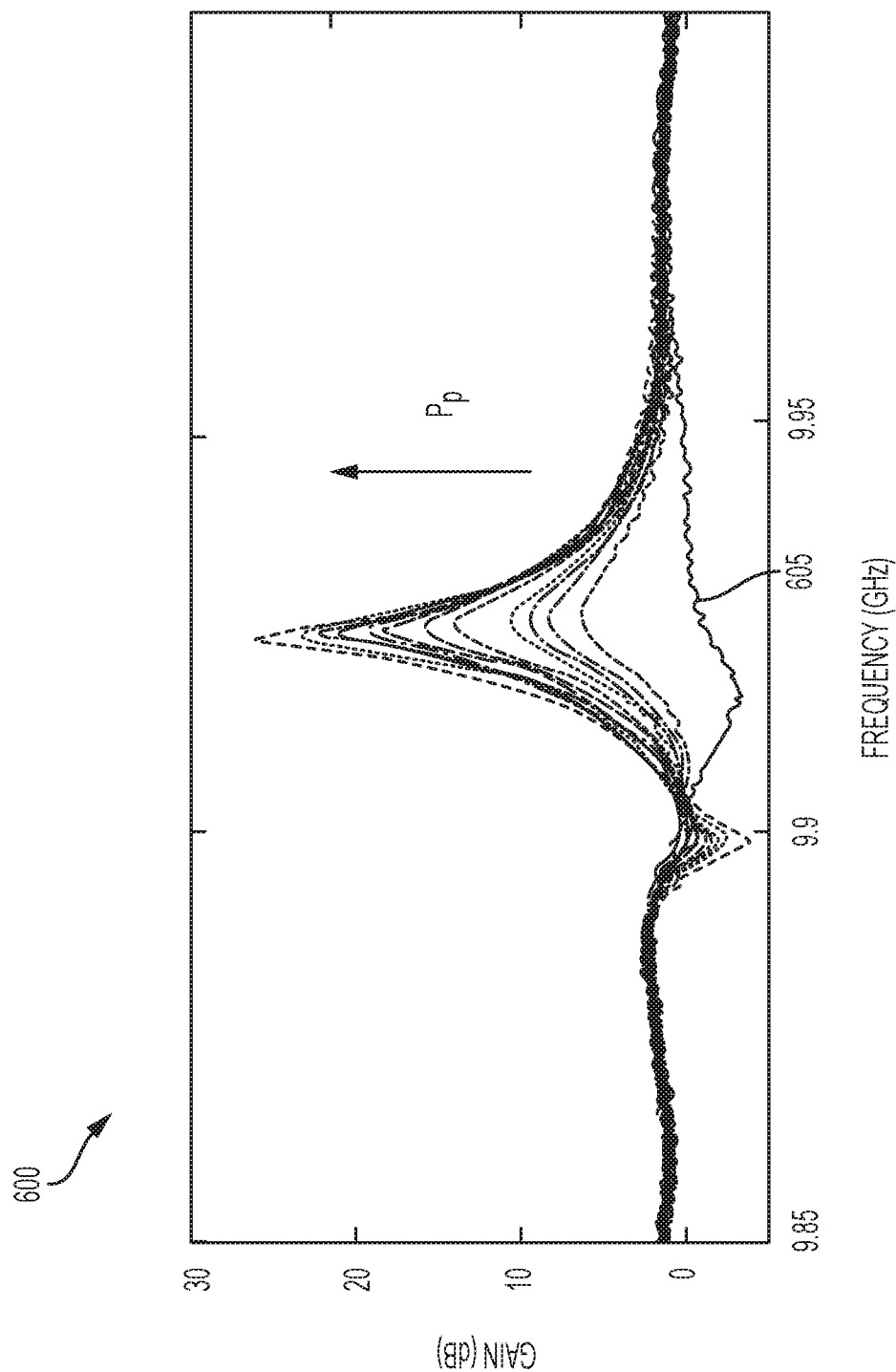
FIG. 6 is a graph showing measured idler (I) gain curves taken while using the lossless on-chip flux line to drive the pump (P) tone according to one or more embodiments.

While using the lossless on-chip flux line to transmit the pump (P) tone, FIG. 5 is a graph 500 illustrating the signal (S) gain curves and FIG. 6 is a graph 600 illustrating the idler (I) gain curves according to one or more embodiments.

The power gain curve of the JPC, G(f) for the signal (S) and idler (I) ports, follows a Lorentzian shape which satisfies the relation:

$$G(f) = \frac{G_{max}}{1 + \left(\frac{f - f_{a,b}}{\frac{BW}{2}}\right)^2}$$

Where $G_{max}$ is the gain peak at resonance, f is the signal/idler tone frequency, $f_{a,b}$ is the resonance frequency of the signal/idler resonator, BW is the dynamical/instantaneous bandwidth of the parametric amplifier which satisfies the amplitude-gain bandwidth product relation given by $\sqrt{G}BW=\gamma$ which is characteristic property of parametric devices, where:

$$\gamma = \frac{2\gamma_S \gamma_I}{\gamma_S + \gamma_I}$$

is the effective bandwidth of device without gain and $\gamma_{S,I}$ is the bandwidth of the signal/idler resonator.

The signal and idler gain curves shown in FIGS. 5 and 6 were measured on the signal (S) and idler (I) ports for a fixed flux bias point, and for varying applied pump powers ($P_p$) at a fixed pump frequency at about 16.86 GHz which was applied to the on-chip flux line. As can be seen in FIGS. 5 and 6, the gain increases with the pump power and have Lorentzian shape (when plotted in linear y-scale) in good agreement with theory. These measurements also show that this device can achieve gains in excess of 20 dB which are required for most high-fidelity readout measurements of superconducting qubits. The bottom curve 505, 605 respectively in FIGS. 5 and 6 represents the JPC amplitude response without pump.

Figure 7:
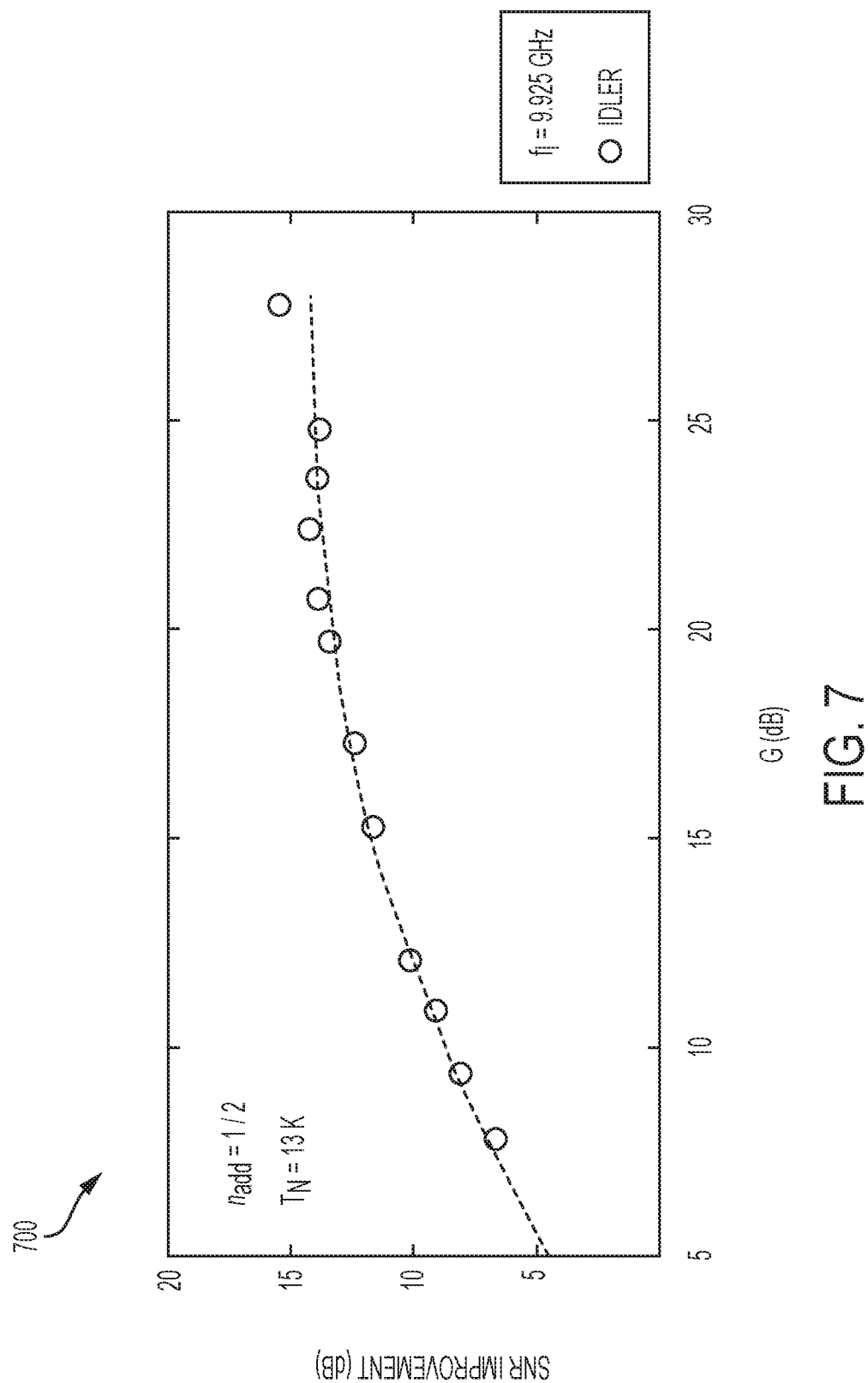
FIG. 7 is a graph illustrating the signal-to-noise improvement on the idler (I) output line according to one or more embodiments.

FIG. 7 is a graph 700 illustrating the signal-to-noise improvement measurement on the idler (I) output line according to one or more embodiments. In this measurement, the operator varies the device gain G at the idler resonance frequency $f_I$ at about 9.925 GHz, and plots on the y-axis the ratio $G/G_N$, where $G_N$ is the ratio of the output chain noise level with pump on versus pump off measured using a spectrum analyzer around $f_I$. The open circles represent data points, whereas the dashed black curve represents a fit based on the theory expression $G/G_N=T_N/(T_N G^{-1}+T_Q(\frac{1}{2}+n_{add}))$, where $T_N$ is the noise temperature of the output line, $T_Q=hf_I/k_B$ is the temperature equivalent of an idler photon where h is Planck constant and $k_B$ is Boltzmann constant, and $n_{add}$ is added noise photons by the JPC when referred back to the input. As can be seen in FIG. 7, the theory fit shows good agreement with the measured data for $n_{add}=1/2$, which means that the amplifier operates near the quantum limit, meaning it adds to the processed signal noise that is very close the minimum noise required by quantum mechanics for a linear phase preserving amplifier.

Figure 8B:
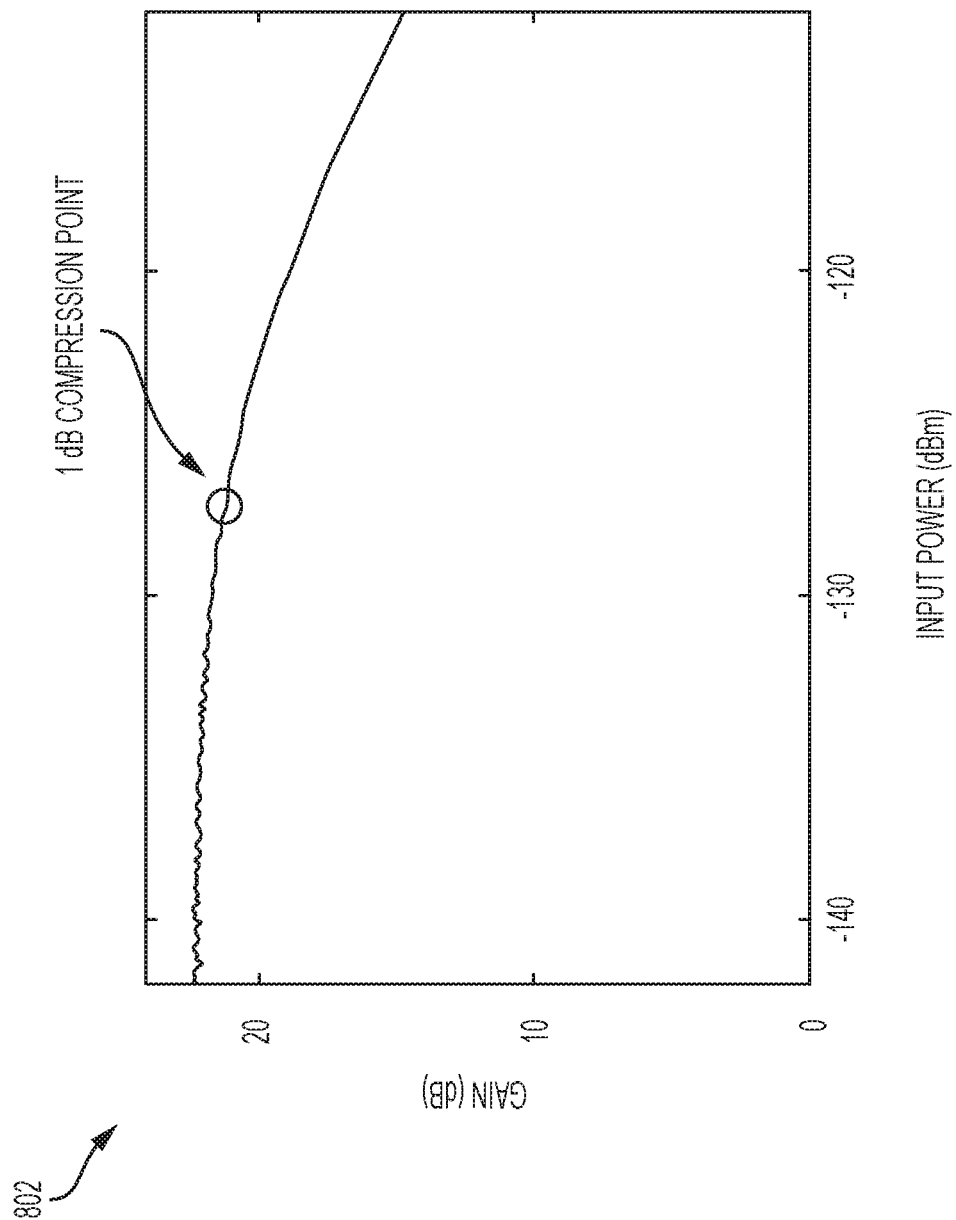

FIGS. 8A and 8B are graphs illustrating the maximum input power on the signal (S) and idler (I) ports measured by driving the pump (P) through the flux line according to one or more embodiments.

In graph 800 of FIG. 8A, the pump (P) drive is fixed and no idler (I) tone is applied. The x-axis shows the input power applied to the signal (S) port at resonance and the y-axis illustrates the gain. FIG. 8A demonstrates the maximum input power which the amplifier (i.e., JPC 100) can handle before it saturates (i.e., the input power at which the gain drops by 1 dB).

In graph 802 of FIG. 8B, the pump (P) drive is fixed and no signal (S) tone is applied. The x-axis shows the input power applied to the idler (I) port at resonance and the y-axis illustrates the gain. Similarly, FIG. 8B demonstrates the maximum input power which the amplifier can handle before it saturates (i.e., the input power at which the gain drops by 1 dB).

Figure 9:
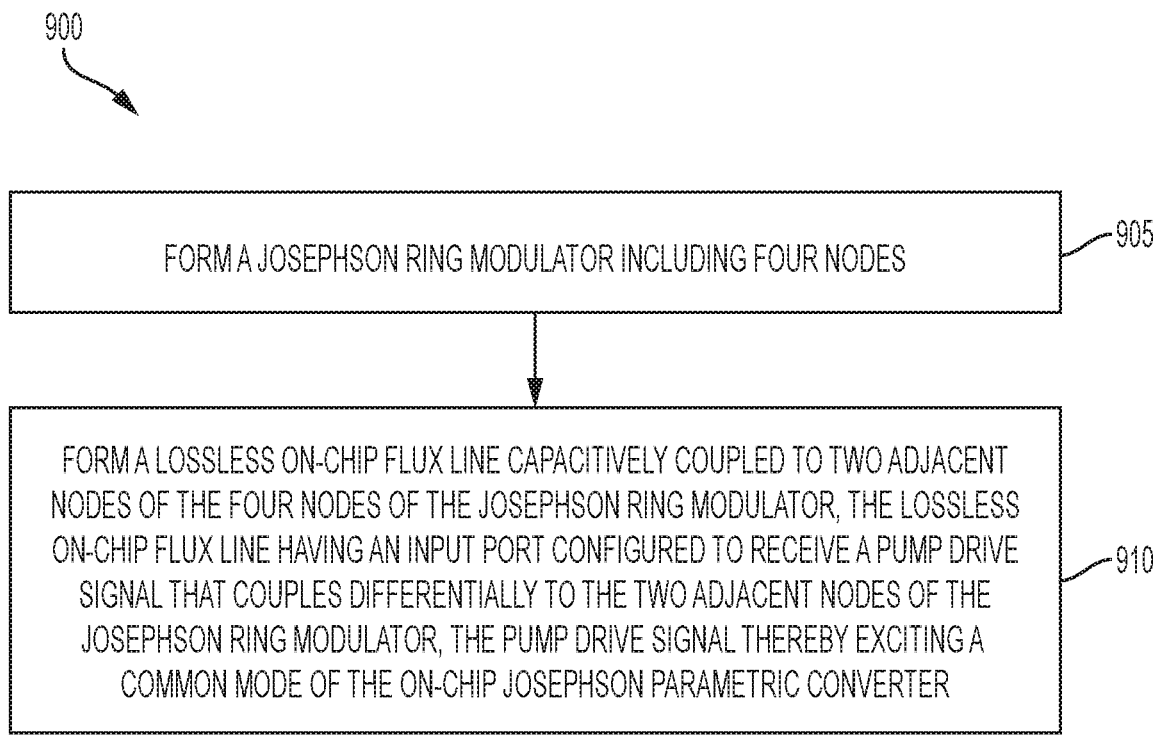
FIG. 9 is a flow chart of a method of forming an on-chip Josephson parametric converter according to one or more embodiments.

FIG. 9 is a flow chart 900 of a method of forming an on-chip Josephson parametric converter 100 according to one or more embodiments.

At block 905, a Josephson ring modulator 110 including four nodes 1, 2, 3, and 4.

At block 910, a lossless on-chip flux line 30 is capacitively coupled to two adjacent nodes (e.g., nodes 2 and 3) of the four nodes 1, 2, 3, 4 of the Josephson ring modulator 110, and the lossless on-chip flux line 30 has an input port/feedline 153 configured to receive a pump (P) drive signal that couples differentially to the two adjacent nodes of the of the Josephson ring modulator 110, where the pump (P) drive signal thereby excites a common mode of the on-chip Josephson parametric converter 100.

The lossless on-chip flux line 30 is a short-circuited coplanar stripline. The short-circuited coplanar stripline includes a first capacitance (e.g., coupling capacitor 12A) between a first node (e.g., node 2) of the two adjacent nodes and a second capacitance (e.g., coupling capacitor 12B) between a second node (e.g., node 3) of the two adjacent nodes of the Josephson ring modulator 110. The first capacitance and the second capacitance (of coupling capacitors 12A and 12B) are based on a proximity (i.e., distance) of the short-circuited coplanar stripline to the first and second nodes (e.g., nodes 2 and 3).

The lossless on-chip flux line 30 is configured to transmit a high frequency microwave signal as the pump (P) drive signal to the two adjacent nodes of the Josephson ring modulator 110, and the high frequency microwave signal is transmitted via a first capacitor 12A and a second capacitor 12B of first and second nodes 2 and 3 of the two adjacent nodes. The high frequency microwave signal ranges from 3-20 gigahertz.

A first resonator (e.g., signal (S) resonator 180, 182, and the JRM 110) and a second resonator (e.g., idler (I) resonator 190, 192, and the JRM 110) intersect at the Josephson ring modulator and respectively enable a first and a second differential mode of the on-chip Josephson parametric converter 100. The first mode may be an eigenmode referred to as the "X" mode where the node 1 is positive and node 2 is negative (or vice versa). The second mode may be an eigenmode referred to as the "Y" mode where node 3 is positive and node 4 is negative (or vice versa).

The first resonator, the second resonator, and the lossless on-chip flux line each have a separate input port (e.g., ports/feedlines 151, 152, 153). The first resonator, the second resonator, the lossless on-chip flux line, and the Josephson ring modulator are each formed of superconducting material. The Josephson ring modulator 110 comprises a plurality of inductors 10A, 10B, 10C, 10D having one end shunted and another end respectively connected to one of the four nodes 1, 2, 3, 4.

FIG. 10 is a flow chart 1000 method of injecting a pump (P) drive tone to an on-chip Josephson parametric converter 100 according to one or more embodiments.

At block 1005, a lossless on-chip flux line 30 is provided in a proximity to a Josephson ring modulator 110 of the on-chip Josephson parametric converter 100 such that the lossless on-chip flux line 30 couples capacitively to two adjacent nodes (e.g., nodes 2 and 3) of the Josephson ring modulator 110.

At block 1010, a microwave signal transmitted as the pump (P) drive tone to the on-chip Josephson parametric converter 100 using a lossless on-chip flux line.

Technical effects and benefits include improved Josephson parametric devices. Technical benefits provide a novel structure and method for inputting the pump (P) drive to the Josephson ring modulator through an on-chip flux line which is separate from the feedlines of the signal (S) and idler (I).

It should be appreciated that the design for superconductor devices may be included in or utilize features of an integrated circuit layout. An integrated circuit (IC) layout is also known as an IC layout, IC mask layout, or mask design. The integrated circuit layout is the representation of an integrated circuit in terms of planar geometric shapes which correspond to the patterns of metal, oxide, semiconductor layers, etc., that make up the components of the integrated circuit. Such an integrated circuit layout, including the layout of a superconductor device, may be stored in a computer readable medium in preparation for fabrication as understood by one skilled in the art.

It will be noted that various microelectronic device fabrication methods may be utilized to fabricate the components/elements discussed herein as understood by one skilled in the art. In superconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An on-chip Josephson parametric converter, comprising:
a Josephson ring modulator;
one or more transmission lines coupled to the Josephson ring modulator, the one or more transmission lines configured to feed the Josephson ring modulator; and
a flux line capacitively coupled to the Josephson ring modulator, the flux line being separate from and not galvanically connected to the one or more transmission lines.

2. The on-chip Josephson parametric converter of claim 1, wherein the flux line comprises an input port configured to receive a pump drive signal that couples differentially to two adjacent nodes of the Josephson ring modulator, the pump drive signal thereby exciting a common mode of the Josephson parametric converter.

3. The on-chip Josephson parametric converter of claim 2, wherein the Josephson ring modulator comprises four nodes which include the two adjacent nodes.

4. The on-chip Josephson parametric converter of claim 2, wherein the flux line is configured to transmit a high frequency microwave signal as the pump drive signal to the two adjacent nodes of the Josephson ring modulator, the high frequency microwave signal being transmitted via a first capacitor and a second capacitor of first and second nodes of the two adjacent nodes.

5. The on-chip Josephson parametric converter of claim 4, wherein the high frequency microwave signal ranges from 3-20 gigahertz.

6. The on-chip Josephson parametric converter of claim 1, wherein the flux line is a lossless on-chip flux line.

7. The on-chip Josephson parametric converter of claim 1, wherein the flux line is a short-circuited coplanar stripline.

8. The on-chip Josephson parametric converter of claim 7, wherein the Josephson ring modulator comprises four nodes; and
wherein the short-circuited coplanar stripline couples to the Josephson ring modulator via a first capacitance at a first node of the four nodes and couples to the Josephson ring modulator via a second capacitance at a second node of the four nodes.

9. The on-chip Josephson parametric converter of claim 8, wherein the first capacitance and the second capacitance are based on a proximity of the short-circuited coplanar stripline to the first and second nodes.

10. The on-chip Josephson parametric converter of claim 1, further comprising a first resonator and a second resonator that intersect at the Josephson ring modulator and respectively enable a first and a second differential mode of the on-chip Josephson parametric converter;
   wherein the one or more transmission lines comprise the first and second resonators.

11. The on-chip Josephson parametric converter of claim 10, wherein the first resonator, the second resonator, and the flux line each have a separate input port.

12. The on-chip Josephson parametric converter of claim 10, wherein the first resonator, the second resonator, the flux line, and the Josephson ring modulator are each formed of superconducting material.

13. The on-chip Josephson parametric converter of claim 1, wherein the Josephson ring modulator comprises a plurality of inductors having one end shunted and another end respectively connected to four nodes of the Josephson ring modulator.

14. A method of forming an on-chip Josephson parametric converter, the method comprising:
   forming a Josephson ring modulator;
   coupling one or more transmission lines to the Josephson ring modulator, the one or more transmission lines configured to feed the Josephson ring modulator; and
   coupling a flux line capacitively to the Josephson ring modulator, the flux line being separate from and not galvanically connected to the one or more transmission lines.

15. The method of claim 14, wherein the flux line comprises an input port configured to receive a pump drive signal that couples differentially to two adjacent nodes of the Josephson ring modulator, the pump drive signal thereby exciting a common mode of the Josephson parametric converter.

16. The method of claim 15, wherein the Josephson ring modulator comprises four nodes which include the two adjacent nodes.

17. The method of claim 14, wherein the flux line is a lossless on-chip flux line.

18. The method of claim 14, wherein the flux line is a short-circuited coplanar stripline.

19. The method of claim 18, wherein the Josephson ring modulator comprises four nodes; and
   wherein the short-circuited coplanar stripline couples to the Josephson ring modulator via a first capacitance at a first node of the four nodes and couples to the Josephson ring modulator via a second capacitance at a second node of the four nodes.

20. A method of providing a pump drive to an on-chip Josephson parametric converter, the method comprising:
   providing a flux line in proximity to a Josephson ring modulator of the on-chip Josephson parametric converter such that the flux line couples capacitively to the Josephson ring modulator; and
   transmitting a microwave signal as the pump drive to the on-chip Josephson parametric converter using the flux line.

* * * * *